United States Patent
Busardo et al.

(10) Patent No.: US 10,570,060 B2
(45) Date of Patent: *Feb. 25, 2020

(54) ION BEAM TREATMENT METHOD FOR PRODUCING SUPERHYDROPHILIC GLASS MATERIALS

(71) Applicant: QUERTECH, Caen (FR)

(72) Inventors: Denis Busardo, Gonneville-sur-mer (FR); Frédéric Guernalec, Liffre (FR)

(73) Assignee: IONICS FRANCE, Hérouville-Saint-Clair (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/780,933

(22) PCT Filed: Mar. 26, 2014

(86) PCT No.: PCT/FR2014/050713
§ 371 (c)(1),
(2) Date: Sep. 28, 2015

(87) PCT Pub. No.: WO2014/155008
PCT Pub. Date: Oct. 2, 2014

(65) Prior Publication Data
US 2016/0052821 A1    Feb. 25, 2016

(30) Foreign Application Priority Data
Mar. 28, 2013    (FR) ...................... 13 00719

(51) Int. Cl.
*C23C 14/48* (2006.01)
*C03C 23/00* (2006.01)
(Continued)

(52) U.S. Cl.
CPC .......... *C03C 23/0055* (2013.01); *C03C 3/087* (2013.01); *C03C 23/008* (2013.01);
(Continued)

(58) Field of Classification Search
CPC ..... C03C 23/0055; C03C 3/087; C23C 14/48; C23C 14/5833; C23C 14/5846;
(Continued)

(56) References Cited

U.S. PATENT DOCUMENTS 4,948,760 A * 8/1990 Ohwaki .............. C03C 23/0055
                                                                    501/54
5,318,806 A * 6/1994 Montgomery ........... B05D 1/62
                                                                    427/488
(Continued)

FOREIGN PATENT DOCUMENTS

WO    WO-2011/001065 A1    1/2011
WO    WO-2012/001325 A2    1/2012
(Continued)

OTHER PUBLICATIONS

A. Lazauskas et al.; "Float Glass Surface Preparation Methods for Improved Chromium Film Adhesive Bonding"; Materials Science, vol. 18, No. 2, 2012 (no month, but accepted Jun. 6, 2011); pp. 181-186.*
(Continued)

*Primary Examiner* — Marianne L Padgett
(74) *Attorney, Agent, or Firm* — Marshall, Gerstein & Borun LLP

(57) ABSTRACT

Process for treatment by an ion beam of a glass material where:
  the acceleration voltage of the ions is between 5 kV and 1000 kV;
  the temperature of the glass material is less than or equal to the glass transition temperature;
  the dose of nitrogen (N) or oxygen (O) ions per unit of surface area is chosen within a range of between $10^{12}$ ions/cm$^2$ and $10^{18}$ ions/cm$^2$ so as to reduce the contact angle of a drop of water below 20°;
(Continued)

a prior pretreatment is carried out with argon (Ar), krypton (Kr) or xenon (Xe) ions in order to strengthen the durability of the superhydrophilic treatment.

Superhydrophilic glass materials of long duration are thus advantageously obtained.

16 Claims, 5 Drawing Sheets

(51) Int. Cl.
    *C23C 14/58*     (2006.01)
    *C03C 3/087*     (2006.01)

(52) U.S. Cl.
    CPC ............ *C23C 14/48* (2013.01); *C23C 14/586* (2013.01); *C23C 14/5833* (2013.01); *C23C 14/5853* (2013.01); *H01J 2237/316* (2013.01); *H01J 2237/3165* (2013.01); *H01J 2237/31701* (2013.01)

(58) Field of Classification Search
    CPC ... C23C 14/586; C23C 14/027; C23C 14/024; H01J 37/1474–1477; H01J 37/226; H01J 37/228; H01J 37/243; H01J 37/244; H01J 37/3005; H01J 37/304; H01J 2237/24571; H01J 2237/24585; H01J 2237/30455; H01J 2237/30466; H01J 2237/316; H01J 2237/31655; H01J 2237/317101; H01J 2237/31703; H01J 2237/31705
    USPC ................................ 427/527, 529, 530, 165
    See application file for complete search history.

(56) References Cited

U.S. PATENT DOCUMENTS

| | | | | |
|---|---|---|---|---|
| 5,580,605 A * | 12/1996 | Ogawa | ................... | B05D 1/185 427/155 |
| 5,997,961 A * | 12/1999 | Feng | ................... | C03C 17/32 427/407.2 |
| 6,300,641 B1 | 10/2001 | Koh et al. | | |
| 6,379,929 B1 * | 4/2002 | Burns | ................... | B01J 19/0093 435/91.1 |
| 6,878,403 B2 * | 4/2005 | Veerasamy | ............. | C03C 17/22 427/249.7 |
| 7,067,175 B2 * | 6/2006 | Veerasamy | ............. | B05D 5/083 427/249.7 |
| 9,981,249 B2 * | 5/2018 | Busardo | ................... | B01J 23/10 |
| 9,988,305 B2 * | 6/2018 | Busardo | ............. | C03C 23/0055 |
| 2002/0127404 A1 * | 9/2002 | Veerasamy | ............. | C03C 17/22 428/408 |
| 2003/0064198 A1 * | 4/2003 | Thomsen | ............... | B05D 5/083 428/172 |
| 2004/0067362 A1 * | 4/2004 | Veerasamy | ............. | C03C 17/22 428/408 |
| 2004/0067363 A1 * | 4/2004 | Bienkiewicz | ............. | C03C 17/22 428/408 |
| 2006/0113239 A1 * | 6/2006 | Okubo | ................ | B01D 17/045 210/348 |
| 2006/0234164 A1 * | 10/2006 | Rhodes | ................. | C08F 232/08 430/311 |
| 2006/0246218 A1 * | 11/2006 | Bienkiewicz | ........... | C23C 16/26 427/249.1 |
| 2007/0074683 A1 * | 4/2007 | Matsuo | ..................... | F01P 9/00 123/41.01 |
| 2008/0036105 A1 * | 2/2008 | Campanelli | ............. | B29C 33/56 264/1.38 |
| 2009/0078326 A1 * | 3/2009 | Rosario | ............ | B01L 3/502707 137/827 |
| 2010/0004144 A1 * | 1/2010 | Little | ................... | B01J 19/0046 506/17 |
| 2010/0090345 A1 * | 4/2010 | Sun | ..................... | C23C 18/1642 257/769 |
| 2012/0019767 A1 * | 1/2012 | Cadet | ..................... | C03C 17/30 351/62 |
| 2012/0103330 A1 * | 5/2012 | David | .................. | C23C 16/325 128/203.12 |
| 2012/0128963 A1 * | 5/2012 | Mao | ....................... | B82Y 30/00 428/304.4 |
| 2012/0147913 A1 * | 6/2012 | Ushinsky | ................ | C30B 29/28 372/34 |
| 2012/0167971 A1 * | 7/2012 | Krasnov | ............... | C23C 14/025 136/256 |
| 2013/0149459 A1 * | 6/2013 | Bruna | .................... | B65D 81/24 427/523 |
| 2013/0171330 A1 * | 7/2013 | Sallak | ...................... | C08J 7/123 427/2.3 |
| 2013/0171334 A1 * | 7/2013 | Bruna | ....................... | A61F 9/00 427/2.14 |
| 2015/0093597 A1 * | 4/2015 | Yerushalmi | .......... | C09C 1/3669 428/702 |
| 2015/0273522 A1 * | 10/2015 | Boscher | ................... | B05D 5/00 428/141 |
| 2015/0299846 A1 * | 10/2015 | Bruna | ...................... | A61L 2/14 427/2.3 |
| 2015/0376058 A1 * | 12/2015 | Busardo | ............. | C03C 23/0055 428/426 |
| 2017/0334775 A1 * | 11/2017 | Navet | ..................... | C23C 14/48 |
| 2018/0194674 A1 * | 7/2018 | Cosijns | ................. | C03C 17/245 |

FOREIGN PATENT DOCUMENTS

| | | | | |
|---|---|---|---|---|
| WO | WO 2012/001326 A2 * | 1/2012 | ............ | C23C 14/48 |
| WO | WO 2012/001328 A2 * | 1/2012 | ............ | C23C 14/48 |
| WO | WO 2012/001330 A2 * | 1/2012 | ............ | C23C 14/48 |

OTHER PUBLICATIONS

M. Bayle et al.; "on the study of oil paint adhesion on optically transparent glass; conservation of reverse painting on glass"; Applied Surface Science; vol. 357; Sep. 7, 2015; pp. 293-301.*
Stella H. North et al.; Effect of Physiochemical Anomalies of Soda-Line Silicate Slides on Biomolecular immobilization; Analytical Chemistry, vol. 82, No. 1; Jan. 1, 2010; pp. 406-412.*
Search Report for FR 1300719, dated Feb. 26, 2014.
Search Report for PCT/FR2014/050713, dated Jun. 3, 2014.

* cited by examiner

ION BEAM TREATMENT METHOD FOR PRODUCING SUPERHYDROPHILIC GLASS MATERIALS

CROSS-REFERENCE TO RELATED APPLICATIONS

This application is a U.S. national stage of International Patent Application No. PCT/FR2014/050713 filed Mar. 26, 2014, which claims the benefit of priority of French Patent Application No. 1300719 filed Mar. 28, 2013.

BACKGROUND

Field of the Disclosure

A subject matter of the invention is a process for the treatment by an ion beam of a glass material and is targeted at greatly reducing the formation of mist over a long period of time. The process of the invention applies to the surface of a glass substrate, for example a transparent glass substrate, such as a mirror, a lens or a sheet glass, so that said surface acquires hydrophilic, even indeed "superhydrophilic", properties.

Brief Description of Related Technology

It is considered that a surface exhibits hydrophilic properties when this surface is characterized by contact angles of water drops of less than 45°.

It is considered that a surface exhibits "superhydrophilic" properties when this surface is characterized by contact angles of water drops of less than 20°, for example of less than 10°. Under these conditions, the surface exhibits in particular antifogging properties.

During the cold seasons, it is well known that the windscreen and the windows of motor vehicles, structural glasses, and spectacles become covered with a mist resulting from the fact that the surface of the abovementioned objects is at a temperature lower than the dew temperature of the ambient atmosphere. There is then produced a condensate of moisture which constitutes a serious nuisance depending on the visibility conditions required. This nuisance is expressed by refraction of the light through the fine droplets which carpet the surface, bringing about deformation of images and resulting in a loss of visibility. This visual nuisance can, for example, increase the risks of accident on the road or spoil a medical diagnosis when a dental mirror or endoscopic lenses are used.

Mechanical fittings, such as windshield wipers, make it possible to remove the mist deposited on a windshield. Hydrophilic or hydrophobic chemicals can also be applied to the surface in order to prevent the formation of mist. However, these chemicals have an effectiveness which is limited over time, repeated washing with water being sufficient to cause them to be disappear.

Processes exist for rendering a surface hydrophilic or hydrophobic.

Mention will be made of a first antifogging process for a mirror covered with a polymer layer subjected to ultraviolet light and then immersed in an aqueous alkaline solution in order to form a high concentration of acid radicals which render the surface of the polymer hydrophilic. However, the surface of the polymer ends up being covered with contaminants, thus gradually losing its hydrophilic characteristics. Washing is then necessary, which can, over a relatively short period of time, destroy the polymer.

Mention will be made of a second process which consists in grafting, to a polymer layer of monomers comprising hydrophilic groups, other monomers comprising hydrophobic groups. Under these conditions, the contact angle of a drop of water does not fall below 50°, in fact not exhibiting sufficient antifogging capabilities.

Another process consists in depositing a layer of metal oxide ($TiO_2$, $SnO_2$, ZnO, $Fe_2O_3$) with a thickness of a few tens of nanometers, indeed even of a few hundred nanometers, exhibiting a photocatalytic function which develops hydrophilic, indeed even superhydrophilic, properties, under the effect of UV light, in conjunction with mold-inhibiting and dirt-repelling properties. However, this hydrophilicity, indeed even superhydrophilicity, can become less marked over time if the surface is placed, for example, in darkness for a relatively long period of time. The hydrophilic surface nature thus depends on the intensity of the light, on its wavelength located in the UV region and on the duration of the photoactivation of the photocatalyst. An excessively low intensity of UV light over an excessively short period of time can also prevent the surface from having sufficient hydrophilic characteristics at a time which would nevertheless require effective antifogging properties. To be more precise, the notion of photocatalysis is closely associated with the material titanium dioxide in its anatase crystallographic variety. $TiO_2$ is a semiconductor capable, under the effect of radiation of appropriate wavelength, of activating radical reactions resulting in the oxidation of organic products. $TiO_2$ has a gap between two energy levels of approximately 3.2 eV, with the result that, according to Planck relationship $E=h\nu$, only the photons having a wavelength of less than or equal to 387 nm will be active in the catalytic photooxidation reaction. Such radiation belongs to the near UV region, with the result that the extension of photocatalysis to the visible region remains for the moment limited. From a practical viewpoint, these photocatalysts are deposited with a layer of silica of approximately 200 nm on the glass material.

"Glass" is understood to mean a noncrystalline (amorphous) solid exhibiting the phenomenon of glass transition. A glass is generally hard, brittle, often transparent and electrically insulating. Generally, the glass is composed of silicon oxide (silica $SiO_2$) and of fluxes; the main constituent for the manufacture is sand. Among all the types of glass, the commonest is soda-lime glass, obtained mainly from silica, soda and lime. Below its glass transition temperature, which is very high, glass exists in the glassy state.

SUMMARY

This results in the need for a method for the surface treatment of glass materials in order to introduce hydrophilic, indeed even superhydrophilic (antifogging), properties which are resistant to mechanical stresses, insensitive to the brightness conditions and effective at any moment which requires it, over a very long period of time, preferably according to methods which can be easily operated industrially, so as to be able to offer such glass materials in a significant amount and at reasonable costs.

The aim of the invention is to provide a method for the treatment of glass materials which is relatively inexpensive and which makes it possible to treat surfaces corresponding to the requirements of numerous applications.

The invention thus provides a process for the treatment by an ion beam of a glass material which comprises an ion bombardment where:

the ions of the ion beam are selected from the ions of the elements from the list consisting of nitrogen (N) and oxygen (O);

the acceleration voltage of the ions is greater than or equal to 5 kV and less than or equal to 1000 kV;

the temperature of the metal layer is less than the glass transition temperature of the glass;

the dose of ions per unit of surface area is chosen within a range of between $10^{12}$ ions/cm$^2$ and $10^{18}$ ions/cm$^2$, so as to modify the surface characteristics of the glass material in the direction of a greater hydrophilicity (a better wettability) which is characterized by a contact angel of a drop of water of less than 45°, indeed even in the direction of a superhydrophilicity which is characterized by a contact angle of a drop of water of less than 20°, preferably of less than 10°.

BRIEF DESCRIPTION OF THE DRAWING FIGURES

DETAILED DESCRIPTION

Figure 1:
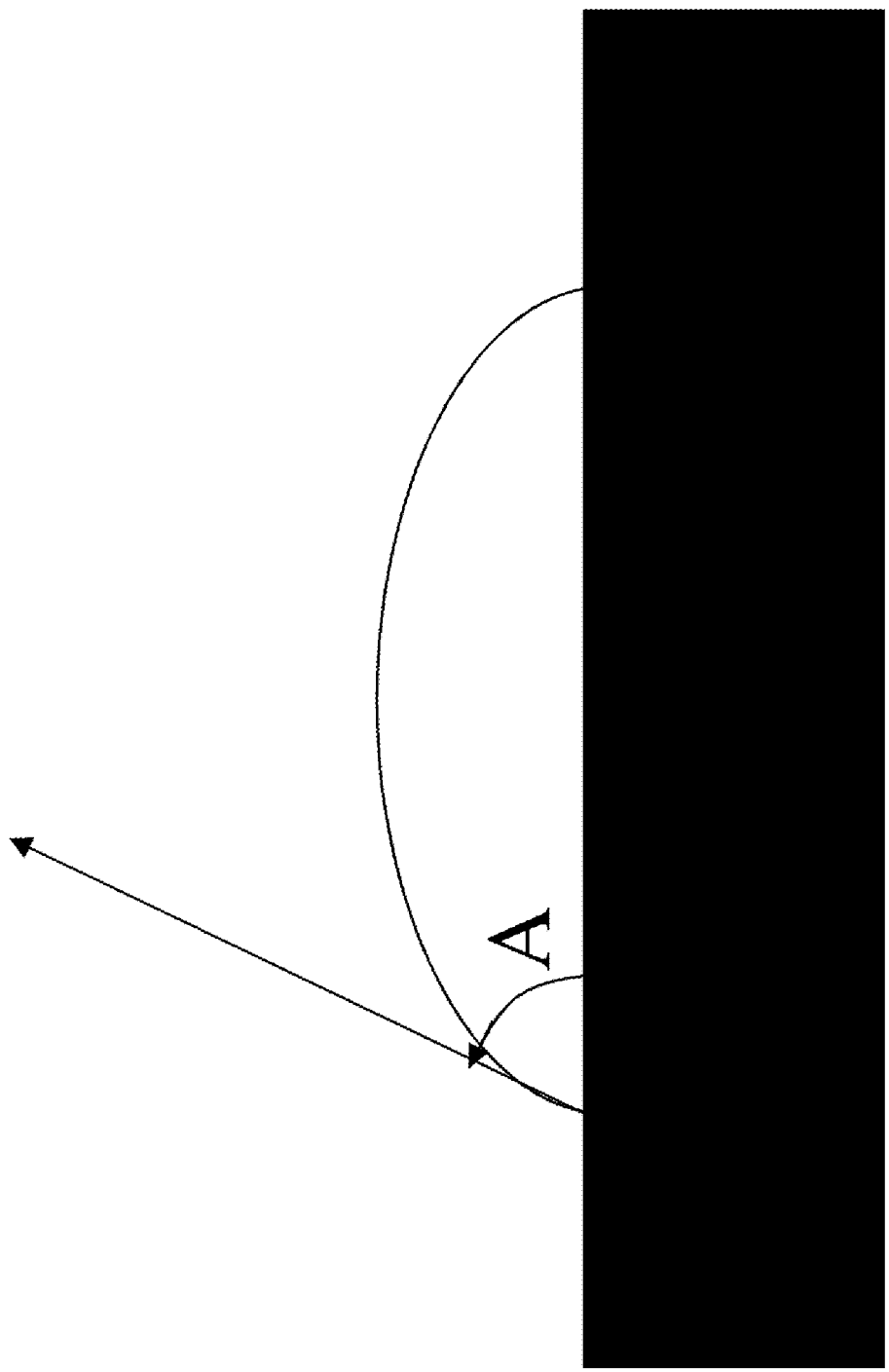
FIG. 1 is a schematic illustration of a drop of water in equilibrium on a flat surface.

The choice of the ions and of the conditions of bombardment of these ions according to the invention makes it possible to advantageously obtain an increase in the hydrophilicity of the glass material which is expressed by a reduction in the contact angle and an increase in the surface energy of the glass material treated. These properties are very important in reducing the formation of mist on a motor vehicle windshield, spectacle lenses, lenses or mirrors of optical devices, or structural glasses. Antifogging property denotes the behavior and the quality of a glass material in slowing down, reducing or preventing the formation of a condensate of moisture in the mist form.

Surprisingly, the inventors have been able to find that the ranges chosen according to the invention for acceleration voltage and dose of ions per unit of surface area make it possible to select experimental conditions where the strengthening of hydrophilic properties toward a superhydrophilicity (characterized by a contact angle of a drop of water of less than 20°, indeed even of less than 10°) associated with antifogging properties is possible by virtue of an ion bombardment.

This superhydrophilicity put at the service of antifogging properties can also prove to be highly advantageous for increasing the surface energy of an optical cladding of an optical fiber, for thus improving the adhesion of the protective cladding (made of polymer) which surrounds the optical cladding.

It is also possible to look for hydrophilic, indeed even superhydrophilic, properties in order to promote the sliding of an elastomer piston in the body of a glass syringe.

In addition, they have been able to find that the process according to the invention can be carried out "under cold conditions", in particular at ambient temperature, and that it is advisable for the temperature of the glass material to remain less than or equal to the transition value of the glass material during the implementation of the process. It is thus possible to advantageously prevent the glass material from undergoing, in its body, a crystallographic modification harmful to its mechanical properties.

The choice of the dose of ions per unit of surface area within the dose range according to the invention can result from a prior calibration stage where a sample consisting of the glass material envisaged is bombarded with one of the ions from N or O. The bombarding of this glass material can be carried out in various regions of the material with a plurality of doses of ions, within the range according to the invention, and the regions treated are observed so as to choose an appropriate dose as a function of the contact angle of a drop of water with the glass material or also the minimum detachment angle of this same drop obtained by inclining the sample with respect to a horizontal plane. Beyond this minimum detachment angle, the drop of water slides and is incorporated on its journey with the other droplets, entraining and removing with it the condensate of moisture constituting the mist.

The treated regions can thus be observed by simple observation techniques, such as a photograph of the drop taken in the plane of the glass material placed on a table, or also the recording of the angle of inclination from which the drop moves over the glass material.

Without wishing to be committed to any one scientific theory, it may be thought that this phenomenon can be explained by the nature of the chemical bonds created by the incident ion in the glass material. The incident ion recombines with the silicon preferably in the form of silicon oxide or silicon nitride, forming highly polarized bonds favorable to the increase in the surface energy, hence an increase in the initial polar nature. Surprisingly, the inventors have been able to find that the surface of the material then assumes a polar, in other words hydrophilic, nature which can be intensified according to the dose and the implantation energy to the point of becoming superhydrophilic (contact angle of a drop of water of less than 20°, indeed even of less than 10°).

Apart from the strengthening of the superhydrophilic properties associated with the antifogging properties independent of the light exposure conditions, the process of the invention makes it possible to harden the surface of the glass material over a thickness of the order of a micron. The process of the invention thus exhibits the advantage of increasing the resistance of the surfaces to the mechanical stresses of the environment.

According to different alternative embodiments:

the glass material is not subjected to any prior ion bombardment treatment;

the glass material is pretreated with noble ions, such as Ar, Kr or Xe. This pretreatment has the effect, by a preferred atomic sputtering mechanism, of depleting the implantation region, of approximately 200 nm in thickness, in alkali metal ions, such as sodium (Na), thus creating a depletion region. This depletion region has the characteristic of being less reactive with regard to leaching processes.

According to the latter embodiment, the soda-lime glass material is treated beforehand with heavy noble ions belonging to the list of the elements consisting of argon (Ar), krypton (Kr) and xenon (Xe). This prior treatment has the role of creating a sodium (Na) depletion region favorable to reducing the phenomenon of leaching of the glass. This is because it should be remembered that an oxide glass generally exhibits a good resistance to corrosion. Nevertheless, the process of weathering the glass can be modified by subjecting the latter to baths of different pH values. In the case of an acidic leaching solution, a mechanism of ion (alkali metal ion/hydrogen species) exchange then takes place between the glass and the bath. There is thus formed, at the surface of the glass, a thin weathering film consisting of the dealkalinized layer. This layer is characterized by a lower refractive index than that of the underlying healthy glass. The decrease in the index is related, on the one hand, to the departure of alkali metal ions from the glass but also to the appearance of pores. These volumes correspond to the cavities left in the matrix by the departure of these ions. The leaching phenomenon is expressed by a bleaching of the glass. A reduction in the presence of sodium at the surface is expressed by a reduction in the appearance of pores.

The inventors have carried out corrosion tests by microgravimetric weighing (difference in weight before and after immersion) of virgin and treated samples of soda-lime glass by immersing them in a hydrochloric acid (HCl) solution with a pH=1, at ambient temperature (20° C.). according to different immersion times. The samples were treated according to two doses, $10^{16}$ and $10^{17}$ ions/cm$^2$, with a beam of multicharged argon (Ar$^+$) ions Ar$^+$, Ar$^{2+}$, Ar$^{3+}$, Ar$^{4+}$, Ar$^{5+}$, the respective intensities of which are 2, 1.29, 0.6, 0.22 and 0.11 mA. These multicharged ions were extracted with a voltage of 40 kV (kilovolts). The surface stoichiometric composition of the glass in silicon (Si), oxygen (O) and sodium (Na), before and after treatment and before immersion in hydrochloric acid (HCl) was analyzed by XPS (X-ray Photoelectron Spectroscopy). These results are recorded in table a. Before each weighing, the samples immersed in hydrochloric acid (HCl) were washed with distilled water and then dried.

TABLE a

|    | virgin  | $10^{16}$ Ar ions/cm$^2$ | $10^{17}$ Ar ions/cm$^2$ |
|----|---------|--------------------------|--------------------------|
| O  | 45.22%  | 47.11                    | 49.36%                   |
| Si | 17.12%  | 18.32                    | 25.09%                   |
| Na | 6.13%   | 3.69                     | 0.92%                    |

The results obtained by XPS demonstrate, under the effect of the treatment by ion bombardment with argon (Ar), the surface depletion in sodium (Na), the concentration of which changes from 6.13% to 3.69% and then to 0.92%.

The inventors have recorded, in table b, for the same virgin glass and glass treated according to two doses $10^{16}$ and $10^{17}$ (Ar ions/cm$^2$) and on just one side, the weights of the samples, expressed in grams, according to different durations of immersion in the HCl solution, expressed in days. The microbalance has an accuracy of 100 micrograms.

TABLE b

|  | Duration of immersion | | |
|---|---|---|---|
|  | 0 days | 1 day | 4 days |
| virgin | 3.7069 | 3.7068 | 3.7067 |
| $10^{16}$ (Ar ions/cm$^2$) | 3.8812 | 3.8812 | 3.8811 |
| $10^{17}$ (Ar ions/cm$^2$) | 3.9523 | 3.9523 | 3.9523 |

Figure 5:
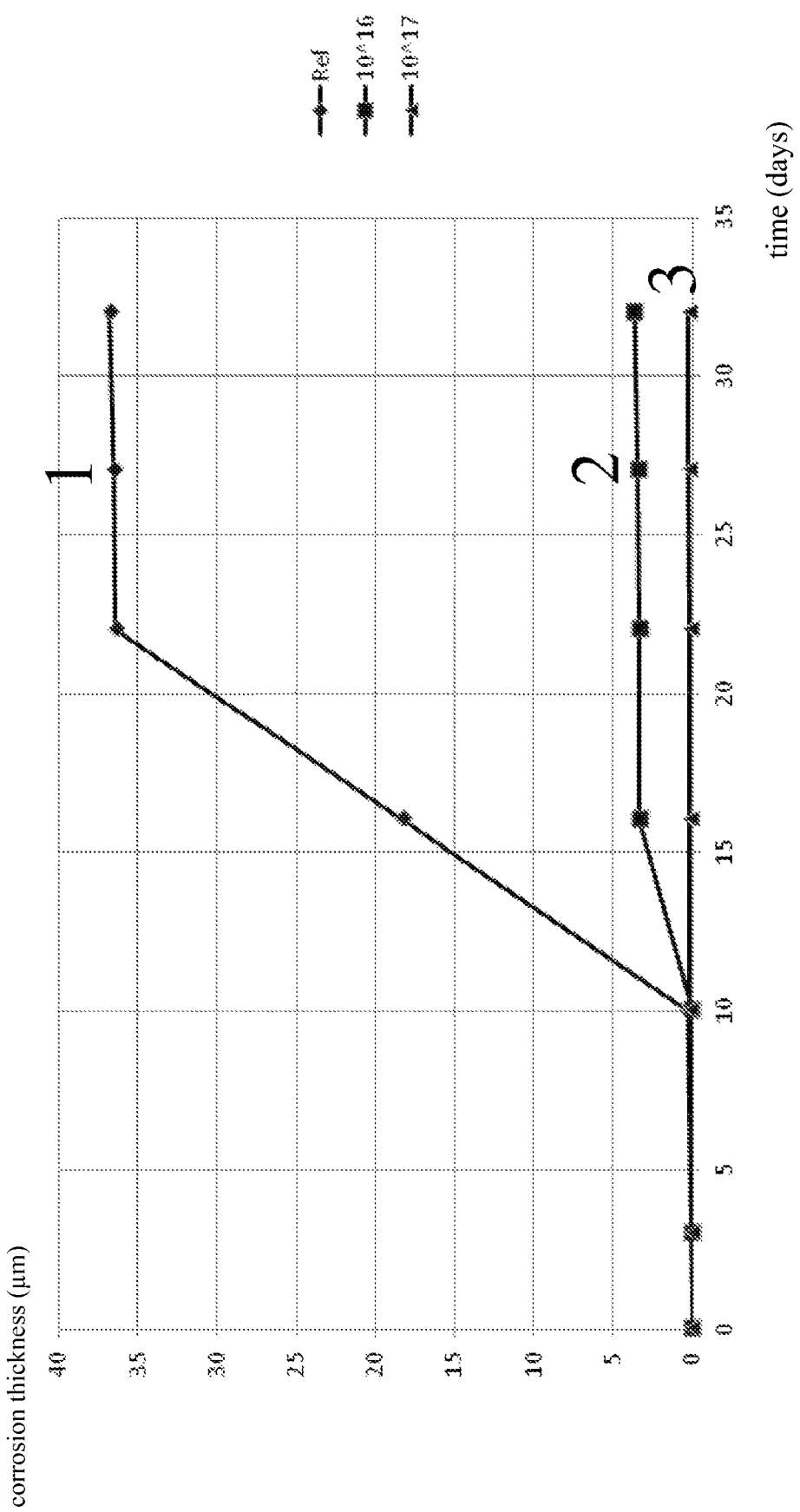
FIG. 5 is a graph illustrating the change in corrosion thickness as a function of time for three glass samples treated in accordance with an embodiment of the disclosure.

On the basis of these results, it is apparent that the rate of corrosion corresponding to the loss in weight is lower for the treated glass than the virgin glass. There thus indeed exists a correlation between the depletion in sodium (Na) and the increase in the resistance to corrosion. FIG. 5 represents this trend over a period of more than 30 days.

The inventors have attempted to extrapolate these experimental results to heavy ions of any type, such as krypton (Kr) and xenon (Xe). In order to approximately evaluate the progression and the trends in the depletion in alkali metals (sodium), the form and the extent of this depletion region, the inventors have developed a semiempirical model based both on the mean degree of sputtering by weight of a soda-lime glass, measured experimentally by loss in weight (microgravimetric weighings carried out before and after bombardment of a sample), and on experimental data relating to the degrees of sputtering associated with the different atomic species participating in the composition of the glass as a function of the type of ion, of their energy and of the dose received (data compiled in the work "Stopping and Range Ions in Matter" (SRIM) by James Ziegler). In this model, the inventors have incorporated the fact that the atoms sputtered out of the glass all originate from the region of travel of the incident ion in the glass and that, when stationary sputtering conditions are achieved (sputtered thickness greater than the thickness of travel of the ion), the experimental degrees of sputtering associated with each of the atomic components participating in the composition of the glass are encountered. By virtue of this model, the inventors have been able to demonstrate that, before reaching stationary sputtering conditions, a depletion region gradually becomes apparent where a mechanism of soda-lime depletion (preferred expulsion by sputtering of the sodium ions) competes, the effects of which are gradually erased by an overall sputtering by weight of the glass. When stationary conditions are achieved, the concentration profile for alkali metal ions stabilizes to give concentrations lower than the initial concentrations.

By using this semiempirical model and by taking as basis a mean initial stoichiometric composition of the soda-lime glass given in table c, the inventors have obtained, for this soda-lime glass bombarded with Ar or Xe heavy ions according to three different energies (20, 40 and 60 keV) and for different doses, the following estimated results:

TABLE c

Initial stoichiometric composition of the soda-lime glass (in %)

| O | 60 |
| Si | 25 |
| Na | 10 |
| Ca | 3 |
| Mg | 1 |
| Al | 1 |
| Total | 100 |

TABLE d

Estimated stoichiometric composition of Na (sodium)

| Dose | After bombardment with Ar | | | After bombardment with Xe | | |
|---|---|---|---|---|---|---|
| (ions/cm$^2$) | 20 keV | 40 keV | 60 keV | 20 keV | 40 keV | 60 keV |
| 0 |  | 10% |  |  |  |  |
| $10^{16}$ | 9.6% | 9.72% | 9.8% | 8% | 8.8% | 8.8% |
| $2 \cdot 10^{16}$ | 9.3% | 9.4% | 9.8% | 3% | 6.5% | 7% |

TABLE d-continued

| | Estimated stoichiometric composition of Na (sodium) | | | | | |
|---|---|---|---|---|---|---|
| | After bombardment with Ar | | | After bombardment with Xe | | |
| Dose (ions/cm$^2$) | 20 keV | 40 keV | 60 keV | 20 keV | 40 keV | 60 keV |
| $5 \cdot 10^{16}$ | 7% | 8% | 8.8% | ~0 | ~0 | 0 |
| $10^{17}$ | ~0% | 5.5% | 7.2% | ~0 | ~0 | ~0 |
| $2 \cdot 10^{17}$ | ~0% | ~0 | 1% | ~0 | ~0 | ~0 |
| $10^{18}$ | ~0% | ~0 | ~0 | ~0 | ~0 | ~0 |

From this semiempirical model, it emerges overall from table d that, for energies of between 10 and 100 keV, the possibility ought to exist of obtaining a significant depletion in sodium (Na) ions, and thus a strengthening of the resistance to leaching, by choosing a dose located:

preferably between $5.10^{16}$ and $5.10^{17}$ ions/cm$^2$ for a bombardment with argon (Ar), preferably between $5.10^{15}$ and $5.10^{16}$ ions/cm$^2$ for a bombardment with xenon (Xe), by extrapolation, a range of between $10^{16}$ and $10^{17}$ ions/cm$^2$ will be given for krypton (Kr).

Figure 3:
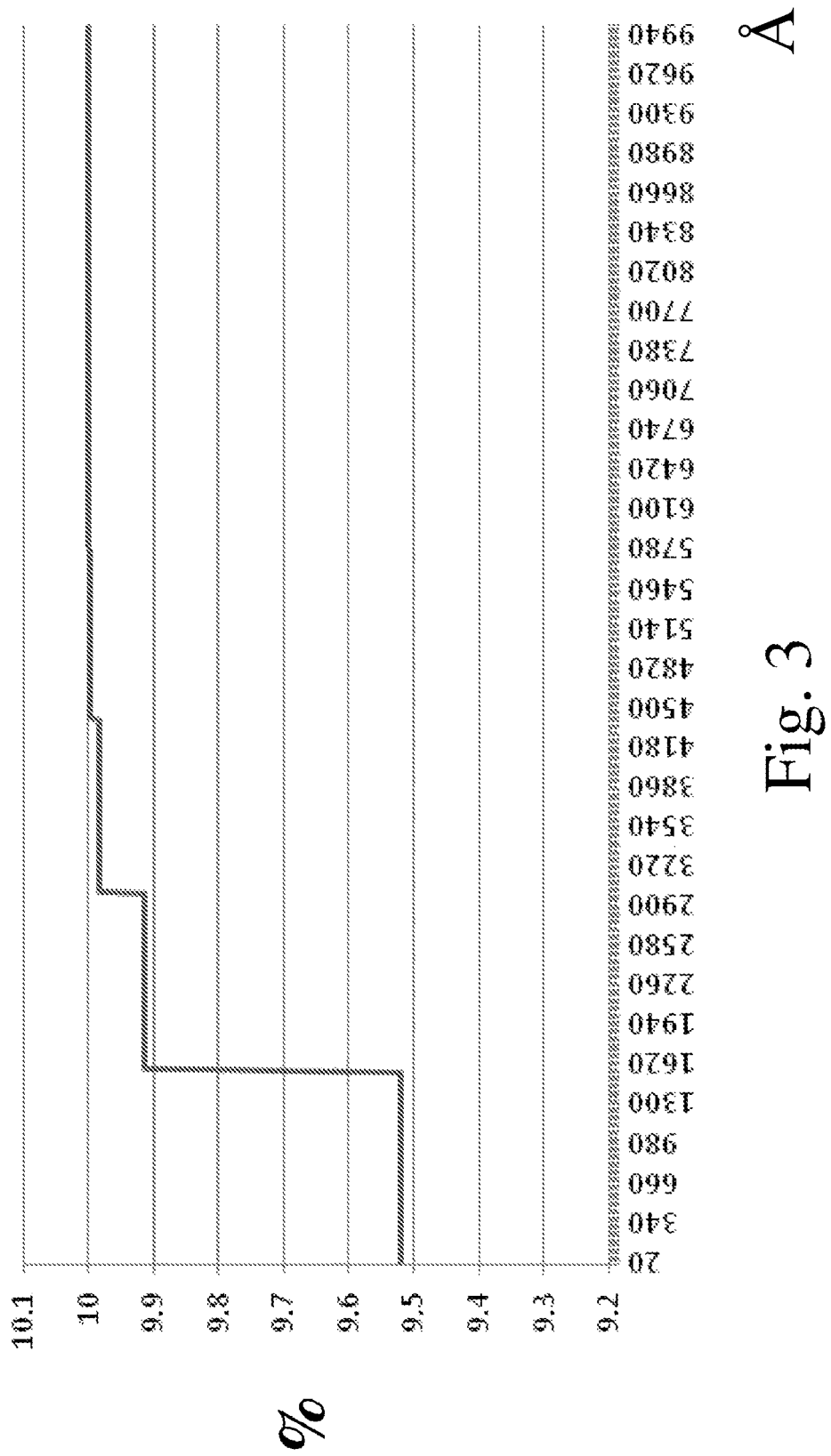
FIG. 3 is a graph illustrating a sodium (Na) atomic concentration profile after bombardment with a beam of argon (Ar) ions with a dose of $1.7 \times 10^{16}$ ions/cm$^2$.
Figure 4:
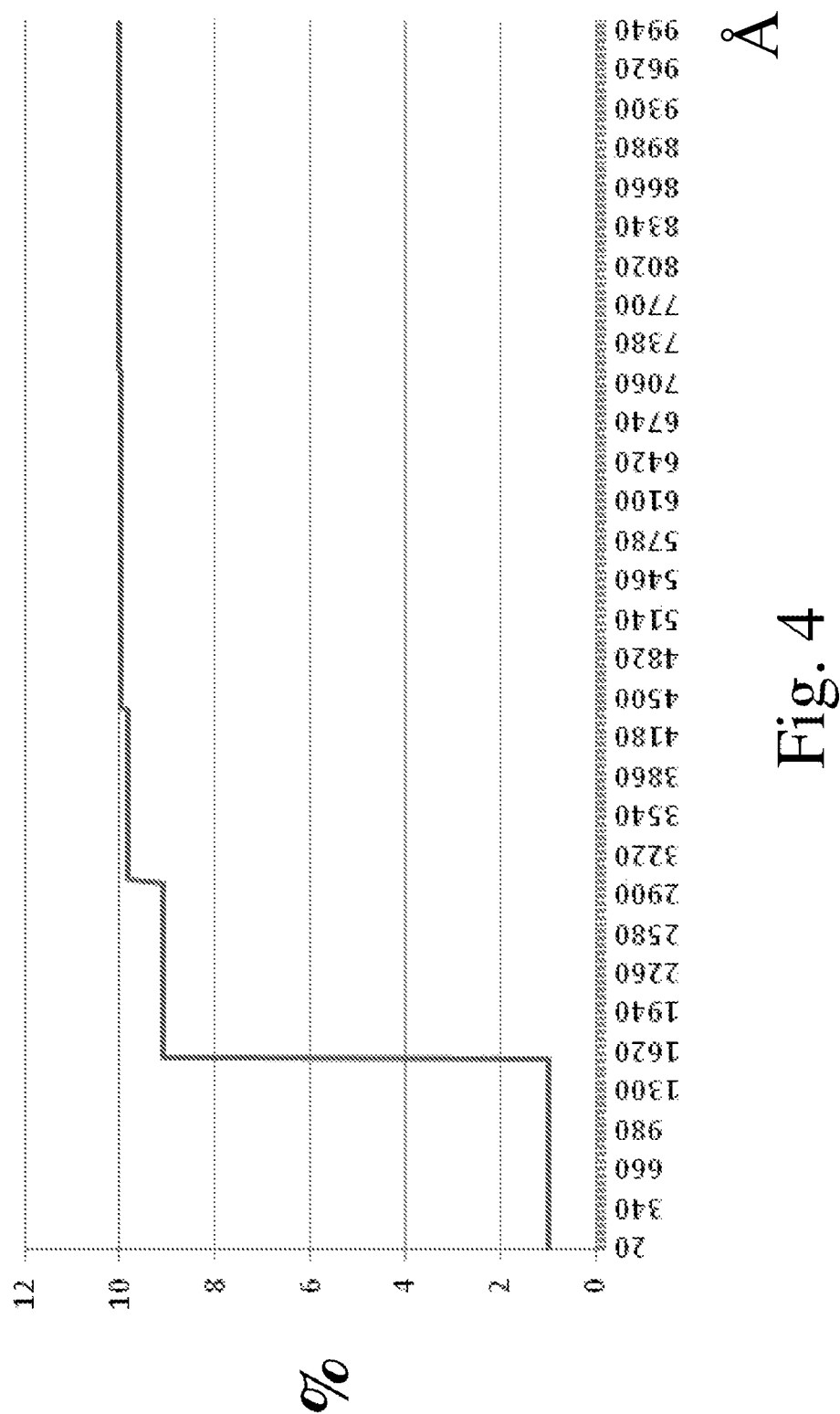
FIG. 4 is a graph illustrating a sodium (Na) atomic concentration profile after bombardment with a beam of argon (Ar) ions with a dose of $1.7 \times 10^{17}$ ions/cm$^2$.

The inventors have extrapolated this semiempirical model for real beams of multicharged ions by combining the effects obtained for multienergy argon Ar$^+$ ions. For a beam of ions composed of multicharged Ar$^+$, Ar$^{2+}$, Ar$^{3+}$, Ar$^{4+}$ and Ar$^{5+}$ ions, the respective intensities of which are 2, 1.29, 0.6, 0.22 and 0.11 mA, extracted with a voltage of 35 kV (kilovolts) and the respective energies of which are 35, 70, 105, 140 and 175 keV (kiloelectron-Volt). The inventors have been able to estimate the concentrations of alkali metal ions Na according to two implantation doses $1.7 \times 10^{16}$ and $1.7 \times 10^{17}$ ions/cm$^2$. FIGS. 3 and 4 represent the sodium (Na) atomic concentration profile after bombardment with this beam of argon (Ar) ions according to a respective dose of $1.7 \times 10^{16}$ and $1.7 \times 10^{17}$ ions/cm$^2$. The concentration profile exhibits a series of plateaus indicating the limits of penetration of the least energetic argon ions (Ar$^+$) to the most energetic argon ions (Ar$^{5+}$). The abscissae correspond to the depth, expressed in angstroms (Å), and the ordinates to the atomic concentration (%). It is found that, for a dose of $1.7 \times 10^{17}$ ions/cm$^2$, the concentration of sodium (Na) is greatly reduced, changing from an initial content of 10% to a residual content of 2% over a depth of approximately 0.16 microns. It may be observed that these semiempirical results are overall validated experimentally by the results obtained by XPS analysis. It should be remembered that, for a dose of approximately $10^{17}$ Ar ions/cm$^2$ extracted at 35 kV (kilovolts), the residual concentration of sodium (Na) measured experimentally by XPS is equal to 0.92% for an initial concentration of 6.13%, to be compared with the residual concentration of 2% predicted by the semiempirical model for an initial concentration of 10%. These results thus validate the choice of the ranges of doses obtained and recommended by the inventors for krypton (Kr) and xenon (Xe) in order to be able to appreciably reduce the concentration of sodium (Na) and to increase the resistance to corrosion.

FIG. 5 represents the change over a long period of time of more than 30 days in the corroded thickness of three square samples (2×2 cm, with a thickness of 0.4 cm): one of the samples is a reference sample which has not formed the subject of any treatment and two samples were treated on just one face with argon (Ar) ions with an energy of 40 keV according to two respective doses equal to $10^{16}$ and $10^{17}$ Ar ions/cm$^2$. These glass samples were immersed in the same HCl solution, pH=1, at ambient temperature (25° C.). The corroded thickness of them was evaluated from the measurements of loss in weight. The axis of the abscissae represents the duration of immersion, expressed in days, and the axis of the ordinates represents the corroded thickness, expressed in micrometers (μm). It is found that the resistance to corrosion of the sample treated with a dose of $10^{17}$ Ar ions/cm$^2$ is greater than that of the sample treated with a dose of $10^{16}$ Ar ions/cm$^2$, which is itself greater than that of the reference sample.

Strengthening the resistance to leaching of the glass by prior treatment with heavy ions can only promote an increase in the durability of the superhydrophilicity obtained by treatment with nitrogen (N) or oxygen (O) ions. In order to make possible the creation of a superhydrophilic layer of very long duration, the inventors thus recommend this pretreatment by bombardment with Ar, Kr or Xe heavy ions within the ranges of doses indicated above, for the purpose of reducing the reactivity the surface to any leaching process.

According to various embodiments of the treatment process of the invention for enhancing the hydrophilic properties of a glass material, which can be combined with one another:

the dose of ions per unit of surface area is between $10^{15}$ ions/cm$^2$ and $10^{18}$ ions/cm$^2$; according to one embodiment, the dose of ions per unit of surface area is between $10^{15}$ ions/cm$^2$ and $10^{17}$ ions/cm$^2$; according to one embodiment, the dose of ions per unit of surface area is between $5.10^{15}$ ions/cm$^2$ and $10^{18}$ ions/cm$^2$;

the acceleration voltage of the ions is between 5 kV and 200 kV; according to one embodiment, the acceleration voltage of the ions is between 10 kV and 100 kV; the acceleration voltage of the ions is between 10 kV and 50 kV; the acceleration voltage of the ions is between 20 kV and 40 kV;

the dose of ions per unit of surface area and the acceleration voltage of the ions are determined so that the surface atomic concentration is greater than or equal to an atomic concentration threshold of 0.1% for nitrogen and an atomic concentration threshold of 2.5% for oxygen;

the ions of the ion beam are nitrogen (N), the acceleration voltage AV is greater than or equal to 10 kV and the dose of ions per unit of surface area is greater than or equal to a value DNmin=(AV/20)$^2$, where DNmin is expressed in $10^{16}$ ions/cm$^2$ and the acceleration voltage AV is expressed in kV, or else the ions of the ion beam are oxygen (O), the acceleration voltage AV is greater than or equal to 10 kV and the dose of ions per unit of surface area is greater than or equal to a value DOmin=10·(AV/20)$^{1.5}$, where DOmin is expressed in $10^{16}$ ions/cm$^2$ and the acceleration voltage AV is expressed in kV;

the ions are produced by an electron cyclotron resonance (ECR) source which produces multicharged ions and has the advantage of being compact and sparing in energy;

the glass material is chosen from the list of the soda-lime glasses.

According to one embodiment, the dose of ions per unit of surface area is between $10^{15}$ ions/cm$^2$ and $10^{17}$ ions/cm$^2$ and the acceleration voltage of the ions is between 10 kV and 50 kV, for example between 20 kV and 40 kV.

According to one embodiment, the hydrophilic treatment process of the invention comprises a preliminary stage where the dose of ions per unit of surface area and the acceleration voltage of the ions are determined according to the following stages:
- a. an acceleration voltage of the ions between 10 kV and 100 kV is chosen;
- b. a dose of ions per unit of surface area of between $10^{15}$ ions/cm$^2$ and $10^{17}$ ions/cm$^2$ is chosen;
- c. a treatment according to the invention is carried out under the conditions chosen;
- d. the contact angle of a drop of water on the glass material thus treated is measured;
- e. the measured contact angle is compared with a desired value for contact angle;
- f. if the measured contact angle is greater than the desired value for contact angle, a treatment according to the invention is again carried out with a dose of ions per unit of surface area double that previously used;
- g. stages c to f are repeated until determining the dose of ions per unit of surface area and the acceleration voltage of the ions in order to obtain a measured contact angle less than or equal to the desired value for contact angle.

According to one embodiment, the desired value for contact angle is less than or equal to 20°, for example equal to 20° or equal to 15° or equal to 10°.

Other distinguishing features and advantages of the present invention will emerge in the description below of non-limiting implementational examples.

According to implementational examples of the present invention, soda-lime glass material samples have formed the subject of studies, with nitrogen ions for some samples and with oxygen ions for other samples. These ions were emitted by an ECR source. The family of the soda-lime glasses combines glasses based on silica SiO$_2$, on calcium and on sodium generally introduced in the manufacture in the form of CaO and Na$_2$O. These glasses are the most widespread; they are used for the manufacture of bottles and glazings and represent of the order of 90% of glass production.

The beam of nitrogen ions with an intensity of 1 mA comprises N$^+$, N$^{2+}$ and N$^{3+}$ ions; the extraction and acceleration voltage is 20 kV; the N$^+$ energy is 20 keV, the N$^{2+}$ energy is 40 keV and the N$^{3+}$ energy is 60 keV.

The beam of oxygen ions with an intensity of 1 mA comprises O$^+$, O$^{2+}$ and O$^{3+}$ ions; the extraction and acceleration voltage is 20 kV; the O$^+$ energy is 20 keV, the O$^{2+}$ energy is 40 keV and the O$^{3+}$ energy is 60 keV.

The sample to be treated moves with respect to the beam with a rate of movement of 120 mm/s with a side advance at each return of 4 mm (10% of the diameter of the beam, which measures 40 mm). The treatment is carried out in several parts in order to achieve the necessary dose.

The hydrophilicity of the surface can be evaluated by depositing a drop of water on the surface. FIG. 1 represents a drop of water in equilibrium on a flat surface. It is possible, by measuring the contact angle (A), to quantify the hydrophilicity of the surface with water. The lower the contact angle, the greater the hydrophilicity of the surface. When the contact angle is less than 20°, for example less than 10°, the surface is superhydrophilic. If the contact angle is greater than 90°, the surface is hydrophobic.

Tests were carried out by depositing drops of water on the surfaces treated by the process of the invention for doses corresponding to $10^{15}$, $10^{16}$ and $10^{17}$ ions/cm$^2$ with an acceleration voltage of 20 kV. The values of the contact angles of the drops of water deposited on the glass material treated respectively with nitrogen ions and oxygen ions according to the process of the invention with different doses are given in tables 1 and 2.

Tests were also carried out by depositing drops of water on the surfaces treated by the process of the invention with nitrogen ions for doses corresponding to $10^{15}$, $10^{16}$ and $10^{17}$ ions/cm$^2$ with an acceleration voltage of 35 kV and are given in the second part of table 1.

TABLE 1

| | Nitrogen | | | |
|---|---|---|---|---|
| | | Glass | | |
| | Virgin | $10^{15}$ ions/cm$^2$ at 20 kV | $10^{16}$ ions/cm$^2$ at 20 kV | $10^{17}$ ions/cm$^2$ at 20 kV |
| Contact angle (°) | 62 | 34 | 9 to 12 | 5 |
| | | Glass | | |
| | virgin | $10^{15}$ ions/cm$^2$ to 35 kV | $10^{16}$ ions/cm$^2$ to 35 kV | $10^{17}$ ions/cm$^2$ to 35 kV |
| Contact angle (°) | 62 | 61 | 56 | 40 |

TABLE 2

| | Oxygen | | | |
|---|---|---|---|---|
| | | Glass | | |
| | virgin | $10^{15}$ ions/cm$^2$ at 20 kV | $10^{16}$ ions/cm$^2$ at 20 kV | $10^{17}$ ions/cm$^2$ at 20 kV |
| Contact angle (°) | 62 | 43 | 29 | 10 |

It is found that hydrophilic properties are obtained with nitrogen or oxygen from $10^{15}$ ions/cm$^2$ for an acceleration voltage of 20 kV. It is found that hydrophilic properties are obtained with nitrogen from $10^{17}$ ions/cm$^2$ for an acceleration voltage of 35 kV. The contact angle decreases with the dose. For the same dose, nitrogen is more effective than oxygen in creating superhydrophilic properties (contact angle less than 20°, in particular less than 10°). For an acceleration voltage of 20 kV, and for nitrogen, superhydrophilic properties are clearly observed from a dose of approximately $10^{16}$ ions/cm$^2$; for oxygen with the same acceleration voltage, it is necessary to achieve a dose approximately ten times greater of $10^{17}$ ions/cm$^2$. Thus, for a soda-lime glass material, there is a change from a hydrophilic behavior to a superhydrophilic behavior which is associated in particular with antifogging properties.

The inventors thus demonstrate that there exists a range of possible doses for achieving a superhydrophilic nature. The minimum dose obtained by this study is $10^{16}$ ions/cm$^2$ for nitrogen and $10^{17}$ ions/cm$^2$ for oxygen and for an acceleration voltage of 20 kV. The inventors estimate that, overall, the dose range for achieving noticeable hydrophilic properties (contact angle of a drop of water less than or equal to 20°) is approximately between $5 \times 10^{15}$ ions/cm$^2$ and $10^{18}$ ions/cm$^2$ for an acceleration voltage of 20 kV.

Furthermore, the inventors have been able to find that, for a greater acceleration voltage equal to 35 kV, the doses required in order to obtain the superhydrophilic properties (contact angle of a drop of water less than 10°) are greater, approximately three times greater, than that required for a voltage of 20 kV, both for nitrogen and for oxygen. For nitrogen, the dose is approximately $3 \times 10^{16}$ ions/cm² and, for oxygen, the dose is approximately $2.5 \times 10^{17}$ ions/cm².

For a voltage of 20 kV, the respective doses of $10^{16}$ nitrogen ions/cm² and $10^{17}$ oxygen ions/cm² correspond, after calculation, to a surface atomic concentration of implanted ions of approximately 0.1% for nitrogen and 2.5% for oxygen.

For a voltage of 35 kV, the respective doses of $3 \times 10^{16}$ nitrogen ions/cm² and $3 \times 10^{17}$ oxygen ions/cm² correspond, after calculation, to a surface atomic concentration (at the furthest surface) of implanted ions of approximately 0.1% for nitrogen and 2.5% for oxygen for a voltage.

On the basis of these experimental results, the inventors have estimated, by calculation, that the surface atomic concentration has to exceed an atomic concentration threshold of approximately 0.1% for nitrogen and 2.5% for oxygen in order to obtain a superhydrophilicity effect. On the basis of this threshold atomic concentration from which these superhydrophilic properties appear, the inventors have been able to calculate, by extrapolation, for a given acceleration voltage, the minimum dose required in order to obtain these superhydrophilic properties. These results are recorded in the table below for nitrogen and oxygen:

For nitrogen, the following results are obtained by extrapolation:

| | Acceleration voltage (kV) | | | | |
|---|---|---|---|---|---|
| | 10 | 20 | 30 | 40 | 50 |
| Minimum dose required ($10^{16}$ ions/cm²) | 0.15 | 1 | 2 | 3.6 | 8.8 |

For an acceleration voltage greater than 10 kV, it is possible to extract, from this table, the empirical formula connecting the minimum dose of nitrogen ions DNmin, expressed in $10^{16}$ ions/cm², to the acceleration voltage AV, expressed in kV:

DNmin=(AV/20)².

For oxygen, the following results are obtained by extrapolation:

| | Acceleration voltage (kV) | | | | |
|---|---|---|---|---|---|
| | 10 | 20 | 30 | 40 | 50 |
| Minimum dose required ($10^{16}$ ions/cm²) | 2.25 | 10 | 17 | 28 | 41 |

For an acceleration voltage greater than 10 kV, it is possible to extract, from this table, the formula connecting the minimum dose of oxygen ions DOmin expressed in $10^{16}$ ions/cm², to the acceleration voltage AV, expressed in kV:

DOmin=10·(AV/20)^{1.5}

Figure 2:
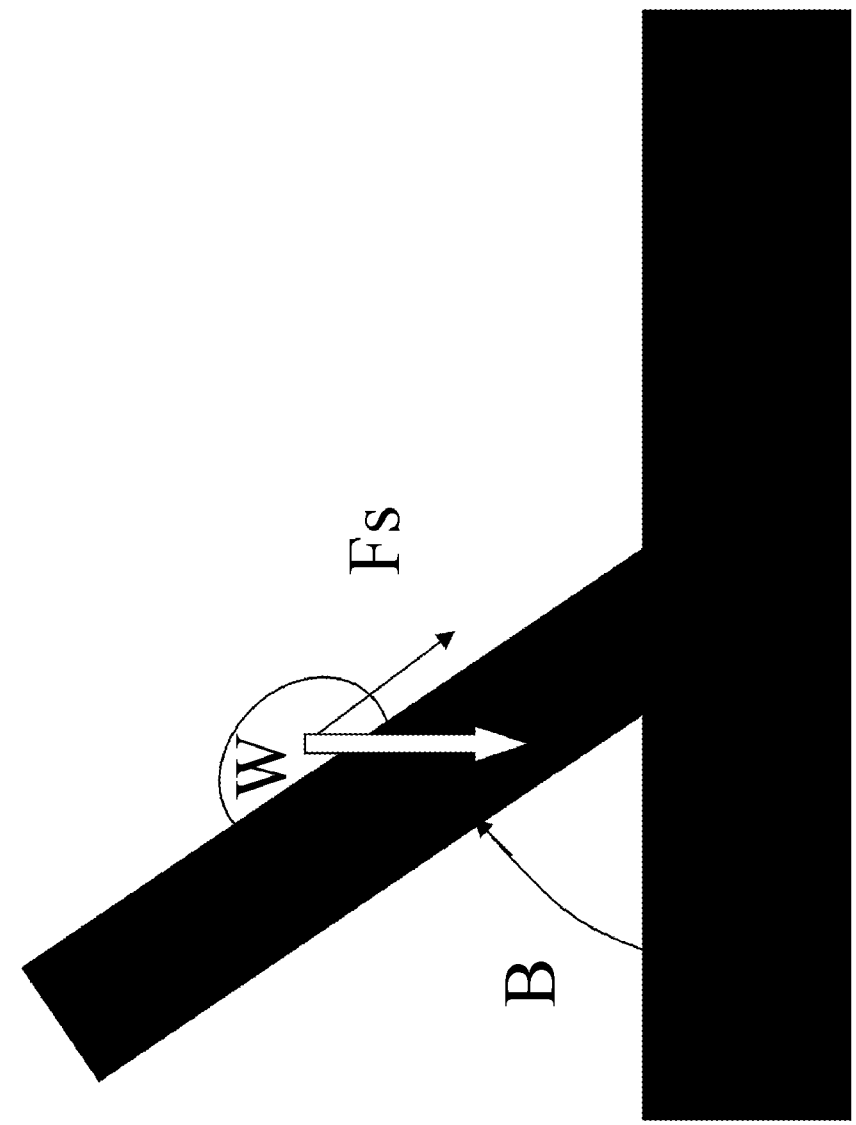
FIG. 2 is a schematic illustration of a device that can measure the detachment angle (B) of a drop of water on the surface.

The ability of a surface to discharge water, thus mist, can be evaluated by measuring the detachment angle (B) of the drop on the surface. FIG. 2 represents a device which makes it possible to measure the detachment angle. The drop is placed on a sample, the angle of inclination of which with respect to the horizontal plane can be varied. The angle (B) is very gradually increased. The weight W of the drop is converted into a tangential force Fs which has the effect of causing the drop to slide over the inclined plane when the angle (B) is greater than a minimum detachment angle which is characteristic of the ability to discharge water on the sample.

The results are combined in tables 3 and 4 respectively for nitrogen and oxygen with ion beams, the characteristics of which are those indicated above.

TABLE 3

| Estimated doses ($10^{16}$ N ions/cm²) | Minimum detachment angle (°) |
|---|---|
| 0 | 55 |
| 0.1 | 33 |
| 1 | 25 |
| 10 | 15 |

TABLE 4

| Estimated doses ($10^{16}$ O ions/cm²) | Minimum detachment angle (°) |
|---|---|
| 0 | 55 |
| 0.1 | 48 |
| 1 | 32 |
| 10 | 20 |

It is found that the samples treated according to the process of the invention exhibit detachment angles lower by 40° than the detachment angle of the virgin sample for nitrogen and by 35° for oxygen. This means that the force necessary in order to cause the drop of water to slide is lower. This sliding force Fs corresponds to the weight W of the drop projected onto the sliding plane: Fs=W×sin(A). On applying this rule, it is estimated that the sliding force of the drop for the virgin sample is equal to W·sin(55°) and, for a dose of $10^{17}$ ions/cm², is equal to W·sin(15°), i.e. a decrease in the adhesion of the drop to the treated glass material by a factor of 70%.

According to different embodiments of the process according to the present invention, which can be combined with one another:

the glass material is movable with respect to the ion beam at a rate, $R_{FP}$, of between 0.1 mm/s and 1000 mm/s. It is thus possible to move the sample in order to treat regions for which the size is greater than that of the beam. The rate of forward progression $R_{FP}$ can be unchanging or variable. According to one embodiment, the glass material moves and the ion beam is stationary. According to another embodiment, the ion beam scans the glass material. It is also possible for the glass material to move when the ion beam is movable. According to one embodiment, the same region of the glass material is moved under the ion beam according to a plurality, N, of passes at the rate $R_{FP}$. It is thus possible to treat the same region of the glass material with a dose of ions corresponding to the sum of the doses of ions received by this region on conclusion of the N passes. It should also be noted that, if the size of the glass material allows it, the treatment stage can be static and result from one or more flashes of ions.

The superhydrophilic surfaces treated according to the process of the invention thus exhibit a threefold advantage:

Of inhibiting the formation of mist independently of the brightness conditions, over a long period of time.

Of bringing about better spreading of the droplets, which merge to give a film of water which evaporates more rapidly.

Of more rapidly discharging the droplets located on slightly inclined planes.

The invention claimed is:

1. A process for surface treating a virgin soda-lime glass, consisting of:
   subjecting the virgin soda-lime glass to a pretreatment ion bombardment prior to a treatment ion bombardment to obtain a pretreated soda-lime glass, wherein:
   the pretreatment ion bombardment is with a pretreatment ion beam, ions of the pretreatment ion beam being ions of elements selected from the group consisting of argon (Ar), xenon (Xe), and krypton (Kr),
   an acceleration voltage of the ions in the pretreatment ion beam is greater than or equal to 5 kV and less than or equal to 1000 kV;
   a temperature of the virgin soda-lime glass during the pretreatment ion bombardment is less than or equal to the glass transition temperature of the virgin soda-lime glass; and
   a dose of ions delivered to the soda-lime glass during the pretreatment ion bombardment as measured in ions per unit of surface area is within a range of between $10^{12}$ ions/cm$^2$ and $10^{18}$ ions/cm$^2$; and
   subjecting the pretreated soda-lime glass to the treatment ion bombardment with a treatment ion beam to obtain a treated soda-lime glass, ions of the treatment ion beam being ions of elements selected from the group consisting of nitrogen (N) and oxygen (O), wherein:
   an acceleration voltage, AV, of the ions in the treatment ion beam is greater than or equal to 5 kV and less than or equal to 1000 kV,
   a temperature of the pre-treated soda-lime glass during the treatment ion bombardment is less than or equal to the glass transition temperature of the virgin soda-lime glass,
   the treatment ion bombardment delivers to the pre-treated soda-lime glass a dose of ions as measured in ions per unit of surface area within a range of between $5 \times 10^{15}$ ions/cm$^2$ and $10^{18}$ ions/cm$^2$
   the treatment ions are produced by electron cyclotron thereby producing multicharged ions, and
   the process for surface treating the virgin soda-lime glass increases hydrophilic properties of the virgin soda-lime glass thereby reducing a contact angle of water drops on the treated soda-lime glass by at least about 40° as compared to the virgin soda-lime glass to obtain a superhydrophilic surface having a resultant contact angle of water drops of less than 20°.

2. The process as claimed in claim 1, wherein the ions of the pretreatment ion beam are argon (Ar) ions, and the dose range for the argon (Ar) ions is between $5 \times 10^{16}$ and $5 \times 10^{17}$ ions per cm$^2$.

3. The process as claimed in claim 1, wherein the ions of the pretreatment ion beam are krypton (Kr) ions, and the dose range for the krypton (Kr) ions is between $10^{16}$ and $10^{17}$ ions per cm$^2$.

4. The process as claimed in claim 1, wherein the ions of the pretreatment ion beam are xenon (Xe) ions, and the dose range for the xenon (Xe) ions is between $5 \times 10^{15}$ and $5 \times 10^{16}$ ions per cm$^2$.

5. The process as claimed in claim 1, wherein the ions of the treatment ion beam are nitrogen ions, and the dose of ions per unit of surface area and the acceleration voltage of the ions are determined so that the surface atomic concentration of nitrogen is greater than or equal to an atomic concentration threshold of 0.1%.

6. The process as claimed in claim 1, wherein the ions of the treatment ion beam are nitrogen (N), the acceleration voltage AV is greater than or equal to 10 kV and the dose of ions per unit of surface area is greater than or equal to a value resulting from an empirical equation DNmin=(AV/20)$^2$, where the resulting value represents the minimum dose of nitrogen atoms DNmin expressed in $10^{16}$ ions/cm$^2$ and the acceleration voltage AV is measured in kV and input into the empirical equation as a unitless value.

7. The process as claimed in claim 1, wherein the ions of the treatment ion beam are oxygen (O), the acceleration voltage AV is greater than or equal to 10 kV and the dose of ions per unit of surface area is greater than or equal to a value resulting from an empirical equation DOmin=10·(AV/20)$^{1.5}$, where the resulting value represents the minimum dose of oxygen atoms DOmin expressed in $10^{16}$ ions/cm$^2$ and the acceleration voltage AV is measured in kV and input into the empirical equation as a unitless value.

8. The process as claimed in claim 1, wherein the glass material is movable with respect to the ion beam at a rate, $R_{FP}$, of between 0.1 mm/s and 1000 mm/s.

9. The process as claimed in claim 8, wherein the same region of the glass material is moved under the ion beam according to a plurality, N, of passes at the rate $R_{FP}$.

10. The use of the process as claimed in claim 1 in order to treat a bulk glass part selected from the group consisting of a motor vehicle windshield, a spectacle lens, a lens of an optical device, a mirror, a window of a building, an optical fiber, and a glass syringe body.

11. The process as claimed in claim 1, wherein the ions of the treatment ion beam are oxygen ions, and the dose of ions per unit of surface area and the acceleration voltage of the ions are determined so that the surface atomic concentration of oxygen is greater than or equal to an atomic concentration threshold of 2.5%.

12. The process as claimed in claim 1, wherein the acceleration voltage, AV, of the ions in the treatment ion beam is greater than or equal to 5 kV and less than or equal to 200 kV.

13. The process as claimed in claim 1, wherein the acceleration voltage, AV, of the ions in the treatment ion beam is greater than or equal to 10 kV and less than or equal to 100 kV.

14. The process as claimed in claim 1, wherein the dose of ions as measured in ions per unit of surface area is in a range of between $10^{16}$ ions/cm$^2$ and $10^{18}$ ions/cm$^2$.

15. The process as claimed in claim 1, wherein the dose of ions as measured in ions per unit of surface area is in a range of $5 \times 10^{15}$ ions/cm$^2$ and $10^{17}$ ions/cm$^2$.

16. A process for rendering a soda-lime glass superhydrophilic, comprising:
   subjecting the soda-lime glass to a pretreatment ion bombardment prior to a treatment ion bombardment to obtain a pretreated soda-lime glass, wherein:
   the pretreatment ion bombardment is with a pretreatment ion beam, ions of the pretreatment ion beam being ions of elements selected from the group consisting of argon (Ar), xenon (Xe), and krypton (Kr) to obtain a pretreated glass material
   an acceleration voltage of the ions in the pretreatment ion beam is greater than or equal to 5 kV and less than or equal to 1000 kV;
   a temperature of the soda-lime glass during the pretreatment ion bombardment is less than or equal to the glass transition temperature of the soda-lime glass; and
   a dose of ions delivered to the soda-lime glass during the pretreatment ion bombardment as measured in ions per unit of surface area is within a range of between $10^{12}$ ions/cm$^2$ and $10^{18}$ ions/cm$^2$; and subjecting the pretreated soda-lime glass to the treatment ion bombardment with a treatment ion beam to obtain a treated soda-lime glass, ions of the treatment ion beam being ions of elements selected from the group consisting of nitrogen (N) and oxygen (O), wherein:

an acceleration voltage, AV, of the ions in the treatment ion beam is greater than or equal to 5 kV and less than or equal to 1000 kV, a temperature of the pretreated soda-lime glass during the treatment ion bombardment is less than or equal to the glass transition temperature of the soda-lime glass, the treatment ion bombardment delivers to the pretreated soda-lime glass a dose of ions as measured in ions per unit of surface area within a range of between $5\times10^{15}$ ions/cm$^2$ and $10^{18}$ ions/cm$^2$, and after the treatment ion bombardment, the treated soda-lime glass has a contact angle of water drops of less than 20° and a minimum detachment angle of water drops that is at least about 35° lower than a minimum detachment angle of water drops of the soda-lime glass prior to the pretreatment ion bombardment and the treatment ion bombardment.

* * * * *